US005661901A

United States Patent [19]

King

[11] Patent Number: 5,661,901
[45] Date of Patent: Sep. 2, 1997

[54] METHOD FOR MOUNTING AND ELECTRICALLY INTERCONNECTING SEMICONDUCTOR DICE

[75] Inventor: Jerrold L. King, Boise, Id.

[73] Assignee: Micron Technology, Inc., Boise, Id.

[21] Appl. No.: 499,931

[22] Filed: Jul. 10, 1995

[51] Int. Cl.[6] ..................................... H05K 3/36
[52] U.S. Cl. ................. 29/830; 257/700; 438/615
[58] Field of Search ....................... 437/226, 209; 257/777, 687, 700, 686; 29/830

[56] References Cited

U.S. PATENT DOCUMENTS

| | | | |
|---|---|---|---|
| 4,488,354 | 12/1984 | Chan et al. | 29/830 |
| 4,764,846 | 8/1988 | Go | 29/830 X |
| 4,899,921 | 2/1990 | Bendet et al. | 228/106 |
| 4,955,131 | 9/1990 | Chall, Jr. | 29/830 |
| 5,014,161 | 5/1991 | Lee et al. | 361/388 |
| 5,126,286 | 6/1992 | Chance | 437/203 |
| 5,146,308 | 9/1992 | Chance et al. | |
| 5,279,029 | 1/1994 | Burns | 29/830 X |
| 5,397,747 | 3/1995 | Angiulli et al. | 437/220 X |
| 5,426,566 | 6/1995 | Beilstein, Jr. et al. | 257/777 X |
| 5,517,057 | 5/1996 | Beilstein, Jr. et al. | 257/777 X |

OTHER PUBLICATIONS

IBM Technical Disclosure vol. 20 No. 11 A Apr. 1978, pp. 4339–4340 by R.A. Henle.
IBM Technical Disclosure vol. 8 No. 11 Apr. 1966 p. 1482 by M.M. Haddad.

*Primary Examiner*—Carl J. Arbes
*Attorney, Agent, or Firm*—Stephen A. Gratton

[57] ABSTRACT

A method for mounting and electrically interconnecting a stack of semiconductor dice on edge to a circuit board is provided. The method forms interconnects adapted to mount each die on edge and establish an electrical connection between contact locations on the die (e.g., bond pads) and corresponding connection points on the circuit board. Each interconnect includes a substrate formed of a material such as silicon or ceramic having a low thermal coefficient of expansion (TCE). Trenches are etched or sawed into the substrate and are then filled with a metal to form conductive traces. Each conductive trace includes contact bump for contacting a contact location on a corresponding die. Z-axis conductive adhesives are used to attach the dice to the interconnects and the interconnects to the circuit board.

24 Claims, 3 Drawing Sheets

5,661,901

METHOD FOR MOUNTING AND ELECTRICALLY INTERCONNECTING SEMICONDUCTOR DICE

FIELD OF THE INVENTION

This invention relates to semiconductor devices and more particularly to an improved method for mounting and electrically interconnecting unpackaged semiconductor dice.

BACKGROUND OF THE INVENTION

Microelectronic packages called "multi chip modules" (MCMs) are constructed with unpackaged semiconductor dice. With a multi chip module, a number of dice are attached to a printed circuit board or other mounting substrate and electrically connected to form various circuits and electronic devices.

One reason for the increased use of multi chip modules is increased system performance. In particular, integrated circuits on multi chip modules can be operated with lower resistances and parasitic capacitances. This is largely a result of decreasing the interconnection length between the dice included in the multi chip module. In addition, overall system performance is improved because the input/output ports can be configured to access the whole module, which can be organized to reduce signal delays and access times. The power requirements are also reduced due to a reduction in the driver requirements.

Typically the unpackaged dice are mounted on a circuit board having an interconnect pattern formed using a process such as screen printing. Different techniques are used for mounting the dice to the board and for providing interconnection and termination of the unpackaged dice. One such technique is referred to as "flip chip bonding". With flip chip bonding, each die is mounted circuit side down, and bond pads on the die are bonded to corresponding connection points on the circuit board. Flip chips are formed similarly to conventional dice but require an additional process step to form solder bumps on the bond pads. Other techniques for mounting the unpackaged dice to the circuit board include wire bonding, tape automated bonding (TAB) and microbump bonding.

In general, with each of these methods the full surface area of the dice (i.e., circuit side or back side) occupies a corresponding area on the circuit board. As is apparent this uses a large surface area of the circuit board. It would be desirable to effect an interconnection between the dice and circuit board in which less surface area is required. This would allow a higher packaging density for the dice.

Another important consideration in constructing multi chip modules is the electrical connection between the bond pads of the unpackaged dice and the connection points on the circuit board. It is important that these electrical connections provide a low resistance or ohmic contact. It is also important to minimize the effect of thermal expansion on the electrical connections. For example, if the dice and the circuit board expand by a different amount, stress can develop at the connection points and compromise the connection.

In view of the foregoing, it is an object of the present invention to provide an improved method for mounting and electrically interconnecting unpackaged semiconductor dice to a circuit board.

It is a further object of the present invention to provide an improved method for interconnecting dice in which a high device density and a reliable electrical connection can be achieved.

It is yet another object of the present invention to provide an improved method for interconnecting dice which can be used with conventional semiconductor dice having flat bond pads.

Other objects, advantages and capabilities of the present invention will become more apparent as the description proceeds.

SUMMARY OF THE INVENTION

In accordance with the present invention, an improved method for mounting and electrically interconnecting semiconductor dice on a supporting substrate, such as a printed circuit board, is provided. The method includes forming a plurality of interconnects on a wafer and then singulating the interconnects by saw cutting along streets of the wafer. Each interconnect is adapted to mount a die on edge to the circuit board. In addition, each interconnect establishes an electrical connection between contact locations on the die (e.g., bond pads) and corresponding connection points on the circuit board.

The wafer and interconnects include a substrate formed of a material such as silicon or alumina, having a low thermal coefficient of expansion (TCE) that matches that of a silicon die. Trenches are etched or sawn into the substrate, insulated with an insulating layer, and then filled with a conductive material to form conductive traces. In the case of sawed trenches, the conductive material would not necessarily cover the length of the trench. Each conductive trace includes a contact bump corresponding to a contact location on the die. In addition, each conductive trace includes an edge portion corresponding to a connection point on the circuit board.

Multiple dice and interconnects are subassembled and then mounted to a circuit board to form a stacked array. For mounting the dice and interconnects to the circuit board, each die is mounted face down on an interconnect with the contact locations on the die in electrical contact with the contact bumps on the interconnect. A z-axis anisotropic conductive adhesive can be used to secure each die to its corresponding interconnect and to provide an electrical connection therebetween. The die-interconnect subassemblies are then placed together in a stacked array of dice and interconnects with the interconnects supporting the dice on edge. A z-axis conductive adhesive, is again used to secure the interconnects to the circuit board and to establish an electrical connection therebetween. With this arrangement, the conductive traces formed on the interconnects provide a circuit path between the connection points on the circuit board and the contact locations on the dice.

DETAILED DESCRIPTION OF THE PREFERRED EMBODIMENTS

Figure 1:
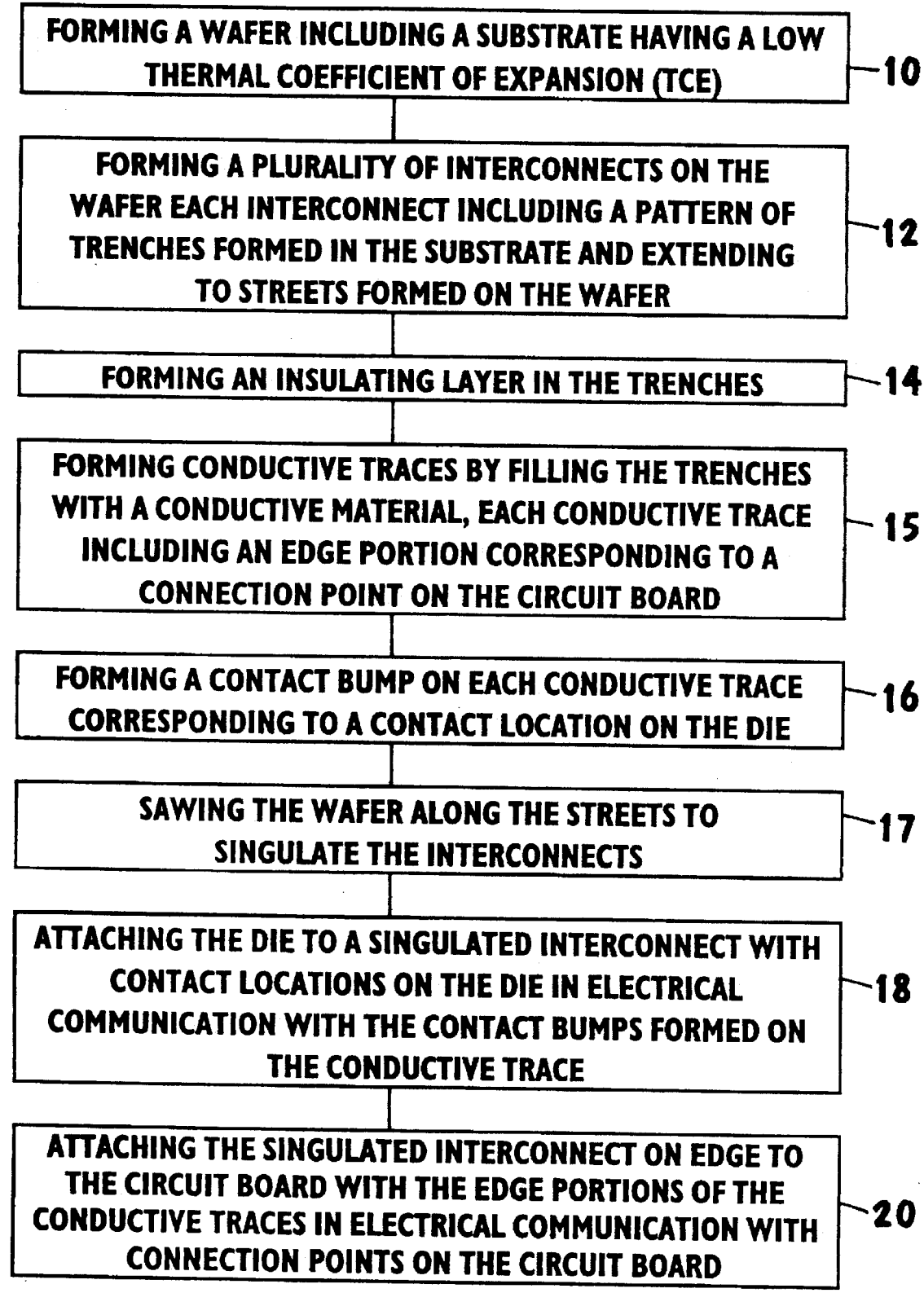
FIG. 1 is a flow diagram illustrating steps included in the method of the invention.

With reference to FIG. 1, a method for mounting and electrically interconnecting an unpackaged semiconductor die to a circuit board includes the steps of:

- forming a wafer including a substrate having a low thermal coefficient of expansion (TCE), step 10;
- forming a plurality of interconnects on the wafer each interconnect including a pattern of trenches formed in the substrate and extending to streets formed on the wafer, step 12;
- forming an insulating layer in the trenches, step 14;
- forming conductive traces by filling the trenches with a conductive material, each conductive trace including an edge portion corresponding to a connection point on the circuit board, step 15;
- forming a contact bump on each conductive trace corresponding to a contact location on the die, step 16;
- sawing the wafer along the streets to singulate the interconnects, step 17;
- attaching the die to a singulated interconnect with contact locations on the die in electrical communication with the contact bumps formed on the conductive traces, step 18; and
- attaching the singulated interconnect on edge to the circuit board with the edge portions of the conductive traces in electrical communication with connection points on the circuit board, step 20.

Figure 2:
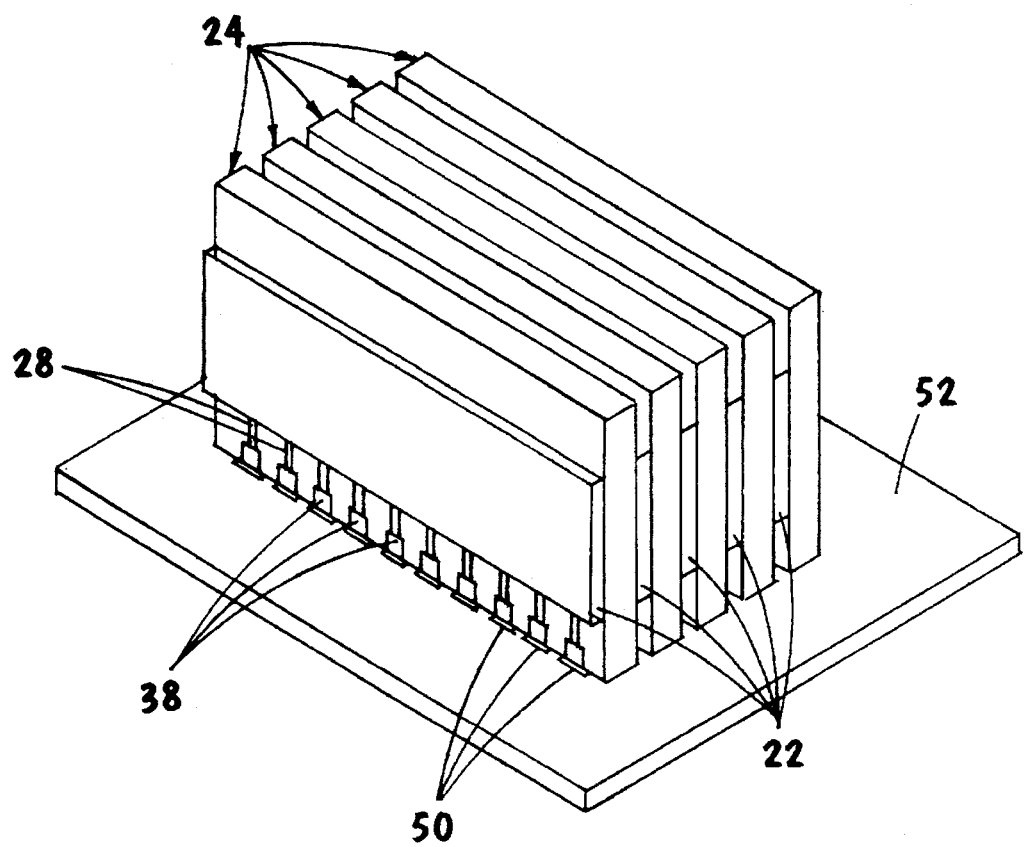
FIG. 2 is a perspective view of semiconductor dice mounted on edge to a circuit board using interconnects constructed in accordance with the invention.

Referring now to FIG. 2, a stack of semiconductor dice 22 are mounted to a circuit board 52 using interconnects 24 constructed in accordance with the invention. The dice 22 and interconnects 24 are mounted on edge in a stacked array. Each die 22 is attached to an interconnect 24 and each interconnect 24 is attached to the circuit board 52.

Figure 3A:
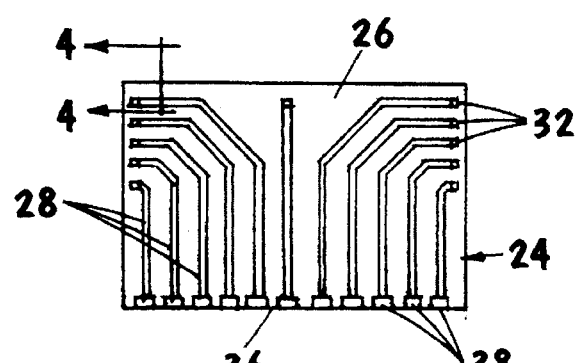
FIG. 3A is a plan view of an interconnect constructed in accordance with the invention.
Figure 3B:
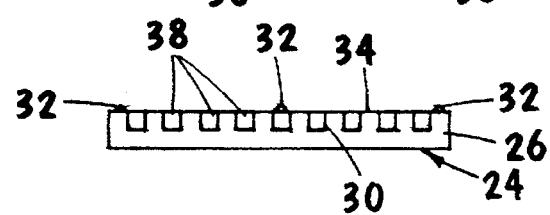
FIG. 3B is a side elevation view of FIG. 3A.

An interconnect 24 is shown separately in FIGS. 3A and 3B. The interconnect 24 includes: a substrate 26; conductive traces 28 formed in trenches 30 (FIG. 3B) in the substrate 26; contact bumps 32 formed on the circuit traces 28; and edge portions 38 formed on the conductive traces 28 along an edge of the interconnect 24.

The substrate 26 is formed of a material having a thermal coefficient of expansion (TCE) that closely matches the TCE for a silicon die. Suitable materials include semiconducting materials such as monocrystalline silicon, polycrystalline silicon, silicon-on-sapphire, silicon-on-glass, and germanium. Another suitable material is a ceramic such as alumina. In addition to having a low TCE that matches the TCE of a silicon die, these materials can be processed using semiconductor fabrication techniques (e.g., etching, oxidation growth, etc.).

Each interconnect 24 is generally rectangular in shape and includes a front surface 34 (FIG. 3B) wherein the trenches 30 and conductive traces 28 (FIG. 3A) are formed. In the illustrative embodiment, each interconnect 24 is formed with a length substantially equal to that of the die 22 and with a width that is slightly larger than the width of the die 22. This provides a surface area for the front surface 34 which is approximately 14 to 28 square mils.

Each interconnect 24 also includes an edge 36 (FIG. 3A) wherein the edge portions 38 of the conductive traces 28 are formed. Preferably a large number of interconnects 24 are formed on a wafer (not shown) and are then singulated using a process such as saw cutting. The edge 36 corresponds to a saw cut or "street" of the wafer.

The trenches 30 (FIG. 3A) for the conductive traces 28 can be formed by etching the substrate 26 or alternately by saw cutting the substrate 26. Preferably, the etch process can be controlled to make the trenches 30 larger for the edge portion 38. Etching can be a wet or dry, isotropic or anisotropic, etch process. Such an etch process can be accomplished by forming a photomask (not shown), or a hard mask (not shown), on the substrate 26 using a photolithographic process (e.g., photoresist deposition, exposure and development). Using the photomask, or hard mask, the substrate 26 can then be etched to form the trenches 30. By way of example, a substrate 26 formed of monocrystalline silicon can be anisotropically etched using a solution of KOH and $H_2O$ or isotropically etched using a solution of HF, $HNO_3$ and $H_2O$.

Figure 4:
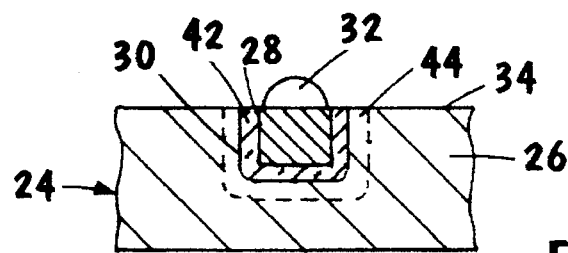
FIG. 4.is an enlarged cross sectional view taken along section line 4—4 of FIG. 3A.
Figure 4A:
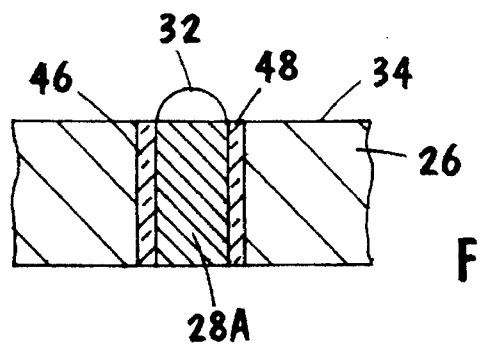
FIG. 4A is an enlarged cross sectional view equivalent to FIG. 4 of an alternate embodiment interconnect formed with through trenches.

In the illustrative embodiment, and as shown in FIG. 4, the substrate 26 is etched to a predetermined depth to form the trenches 30. The trenches 30 are then filled with a conductive metal to form the conductive traces 28. Alternately, as shown in FIG. 4A, the substrate 26A can be etched completely through to form through openings 46 rather than trenches 30 (FIG. 4). As will be more fully explained, the through openings 46 can be more easily filled with a conductive metal using an electrodeposition process.

In the illustrative embodiment, the trenches 30 are formed with edge portions 38 having a diameter (i.e., width) and a spacing (i.e., pitch) that corresponds to the width and spacing of bond pads 40 on the semiconductor die 22. By way of example and not limitation, the edge portions 38 of the trenches can be on the order of about 40 μm to 250 μm and the spacing on the order of about 50 μm to 150 μm. A depth of the trenches 30 will be on the order of about 100 μm to 350 μm.

Following formation of the trenches 30 and as shown in FIG. 4, an insulating layer 42 is formed on the sidewalls and bottom surface of the trenches 30. The insulating layer 42 is preferably an oxide such as $SiO_2$ that can be formed by an oxidation growth process or by a deposition process such as CVD. By way of example, TEOS (tetraethylorthosilane) can be used to grow $SiO_2$ at a temperature of about 400° C. A representative thickness for the insulating layer 42 is from about 500 Å to 6000 Å. FIG. 4A illustrates an insulating layer 48 formed on the alternate embodiment having a through opening 46.

The purpose of the insulating layer 42 (or 48) is to electrically isolate the conductive traces 28 formed in the trenches 30 from the remainder of the substrate 26. A channel stop 44 (FIG. 4) can also be employed in place of, or in addition to, the insulating layer 42 to electrically isolate the conductive traces 28. By way of example, for a substrate 26 formed of P-type silicon, the channel stop 44 can be formed by doping the substrate 26 with an n-type dopant such as phosphorus or arsenic. In some cases, particularly with a substrate 26 formed of an insulating material such as a ceramic, an insulating layer is not required.

Still referring to FIG. 4, following formation of the insulating layer 42 the conductive traces 28 are formed by depositing a conductive metal within the trenches 30. The conductive traces 28 can be formed of any metal deposited by any suitable deposition process. Exemplary metals include nickel, aluminum, tungsten, molybdenum, copper, titanium, platinum, or an alloy of these or other metals. Suitable deposition processes include sputtering, CVD, electron beam deposition, electroplating and electroless deposition. In addition, wave soldering techniques similar to those employed for forming patterned conductive lines for printed circuit boards can also be employed to form the conductive traces 28. FIG. 4A illustrates a conductive trace 28A formed in the through opening 46.

Preferably, the conductive traces 28 (or 28A) are formed with an exposed upper surface that is co-planar with the front surface 34 of the substrate 26. The conductive traces 28 can be initially deposited to be substantially co-planar to the front surface 34 or can be deposited with excess material and then planarized following deposition. A suitable method of planarization is with chemical mechanical planarization (CMP). Other methods of planarization such as an etch back process using a dry etch or reverse electroplating can also be employed.

As also shown in FIG. 4, the conductive traces 28 include the contact bumps 32 formed at one end for establishing electrical contact with the bond pads 40 (FIG. 5) on the die 22. FIG. 3A shows the relative location of the contact bumps 32 on the conductive traces 28. These locations would correspond to the locations of the bond pads 40 on the die 22. The contact bumps 32 are formed of a conductive metal such as tungsten deposited on the conductive traces 28 using a process such as electrodeposition or CVD. The contact bumps 32 have a diameter of about 25 μm to 75 μm. These contact bumps 32 are similar in size and shape to the solder bumps formed on bumped die used for flip chip bonding.

Figure 5:
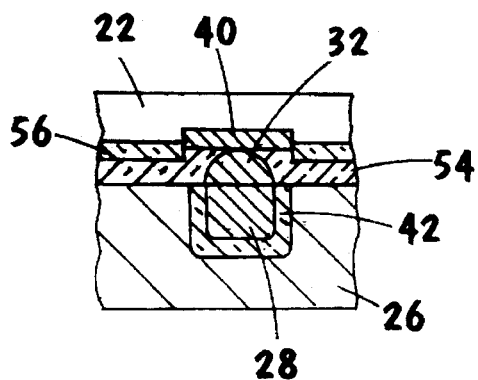
FIG. 5 is a cross sectional view illustrating a contact bump of an interconnect electrically engaging a contact location on a semiconductor die.

After fabrication of the interconnect 24 using the above outlined process, a plurality of interconnects 24 and dice 22 can be assembled in a stacked array as shown in FIG. 2. Initially, each die 22 is attached to a respective interconnect 24 using a conductive material. Suitable conductive materials are conductive adhesives, z-axis anisotropic adhesives, and solder. This is shown in FIG. 5. In FIG. 5 the semiconductor die 22 includes a bond pad 40 embedded in a passivation layer 56. The bond pad 40 is placed in alignment with a contact bump 32 formed on a conductive trace 38 of the interconnect 24 as previously described. The contact bump 32 and bond pad 40 can be placed in alignment using a vision system and techniques employed for flip chip alignment. By way of example, an aligner bonder tool such as described in U.S. Pat. No. 4,899,921 to Bendat et al. incorporated herein by reference, can be used to align the contact bumps 32 on the interconnect 24 with the bond pads 40 on the die 22.

A z-axis anisotropic adhesive 54 is used to secure the die 22 to the interconnect 24 and to establish an electrical connection between the bond pads 40 on the die and the contact bumps 32 on the interconnect. Z-axis anisotropic adhesives are filled with conductive particles which do not contact each other in the x-y plane. Compression in the z-direction establishes an electrical path. Z-axis anisotropic adhesives are formed as a viscous paste or as a film that is applied and then cured under compression to harden.

Suitable z-axis anisotropic adhesives are sold under the trademarks: "X-poly™" and "Z-poly™", by A.I. Technology, Trenton, N.J.; and "Shel-Zac™" by Sheldahl, Northfield, Minn. Z-axis anisotropic adhesives are also sold by 3M, St. Paul, Minn.

The z-axis anisotropic adhesive 54 can be deposited on the contact bump 32 or bond pad 40 using a suitable process. For a z-axis anisotropic adhesive 54 formed as a viscous paste, a screen printing process can be used. A z-axis anisotropic adhesive 54 formed as a film can be cut in a required patterned and then placed into contact with the contact bump 32 and bond pad 40.

Following attachment of each die 22 to a respective interconnect 24, a stacked array of interconnects is formed as shown in FIG. 2. The interconnects 24 are attached on edge to the circuit board 52 again using a z-axis anisotropic adhesive 54. The z-axis anisotropic adhesive 54 also establishes an electrical connection between connection points 50 on the circuit board 52 and the edge portions 38 of the conductive traces 28. The connection points 50 can be formed as flat or raised metal pads which are in electrical communication with printed circuits and electrical components formed on the circuit board 52.

Figure 6:
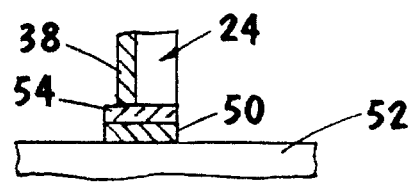
FIG. 6 is a cross sectional view illustrating an edge portion of the interconnect electrically connected to a connection point formed on the circuit board.

FIG. 6 is an enlarged cross sectional view illustrating an edge portion 38 of a conductive trace 28 for the interconnect 24 in electrical communication with a connection point 50 on the circuit board 52. Using this arrangement, an electrical path is established from the electrical circuits on the circuit board 52, through the connection pad 50 on the circuit board 52, through the z-axis anisotropic adhesive 54, through the edge portions 38 of the conductive traces 28 (FIG. 2), through the conductive traces 28, through the contact bumps 32 on the conductive traces 28 and to the bond pads 40 on the die 22.

The invention thus provides an improved method for mounting and electrically interconnecting unpackaged semiconductor dice on edge to a circuit board. While the invention has been described with reference to certain preferred embodiments, as will be apparent to those skilled in the art, certain changes and modifications can be made without departing from the scope of the invention as defined by the following claims.

What is claimed is:

1. A method for mounting an unpackaged semiconductor die to a supporting substrate, said method comprising:

forming an interconnect including a substrate having a plurality conductive traces extending to an edge thereof, each said conductive trace including an insulated trench filled with a conductive material;

attaching a die to the interconnect with contact locations on the die in electrical communication with the conductive traces; and attaching the interconnect on edge to the supporting substrate with edge portions of the conductive traces in electrical communication with connection points on the supporting substrate.

2. The method as claimed in claim 1 and further comprising forming a plurality of interconnects on a wafer and then singulating the wafer.

3. The method as claimed in claim 2 and wherein the interconnects and dice are attached to the supporting substrate in a stacked array.

4. The method as claimed in claim 3 and wherein the dice are attached to the interconnects using a conductive material.

5. The method as claimed in claim 4 and wherein the interconnects are attached to the supporting substrate using the conductive material.

6. The method as claimed in claim 5 and wherein the wafer is formed of a material selected from the class consisting of silicon and ceramic.

7. The method as claimed in claim 6 and wherein the trenches are formed by etching the wafer.

8. The method as claimed in claim 6 and wherein the trenches are formed by saw cutting the wafer.

9. The method as claimed in claim 6 and wherein the trenches are formed as through openings in the wafer.

10. The method as claimed in claim 6 and wherein the trenches are insulated using a grown oxide layer.

11. A method for attaching an unpackaged semiconductor die to a circuit board, comprising:

forming a wafer including a substrate;

forming a pattern of trenches in the substrate;

forming conductive traces by filling the trenches with a conductive material, each conductive trace having an edge portion extending to a street of the wafer;

forming contact bumps on the conductive traces corresponding to contact locations on the die;

singulating the wafer along the streets thereof to form a plurality of interconnects;

attaching the die to an interconnect with contact locations on the die in electrical communication with the contact bumps on the conductive traces; and attaching the interconnect on edge to the circuit board with the edge portions of the conductive traces in electrical communication with connection points on the circuit board.

12. The method as claimed in claim 11 and wherein the die is attached to the interconnect using a conductive adhesive.

13. The method as claimed in claim 11 and wherein the interconnect is attached to the circuit board using a conducive adhesive.

14. The method as claimed in claim 11 and wherein the trenches are formed using an etching process.

15. The method as claimed in claim 11 and wherein the trenches are formed by saw cutting.

16. The method as claimed in claim 11 and further comprising forming a channel stop by implanting a dopant around the trenches.

17. The method as claimed in claim 11 and wherein a plurality of dice are attached to a plurality of interconnects attached to the circuit board as a stacked array.

18. A method for attaching a plurality of unpackaged semiconductor dice to a circuit board, comprising:

forming a plurality of interconnects each including a substrate formed of a material selected from the class consisting of silicon and ceramic;

each said substrate including a pattern of conductive traces comprising insulated trenches filled with a conductive material, each said conductive trace extending to an edge of the substrate and including a contact bump corresponding to a contact location on a die;

attaching each die to a respective interconnect with the contact locations of the die in electrical communication with the contact bumps on the conductive traces; and attaching the interconnects on edge to the circuit board with the conductive traces in electrical communication with connection points on the circuit board to form a stacked array of dice and interconnects.

19. The method as claimed in claim 18 and wherein the conductive traces are formed to be co-planar with a surface of the substrates.

20. The method as claimed in claim 19 and wherein the conductive traces are planarized.

21. The method as claimed in claim 20 and wherein the dice are attached to the interconnects and the interconnects are attached to the circuit board using a z-axis anisotropic adhesive.

22. A method for attaching a plurality of unpackaged semiconductor dice to a circuit board, comprising:

forming a wafer including a substrate having a low thermal coefficient of expansion (TCE);

forming a plurality of interconnects on the wafer each interconnect including a pattern of trenches formed in the substrate and extending to streets formed on the wafer;

forming conductive traces by filling the trenches with a conductive material, each conductive trace including an edge portion corresponding to a connection point on the circuit board;

forming a contact bump on each conductive trace corresponding to a contact location on the die;

sawing the wafer along the streets to singulate the interconnects;

attaching the die to a singulated interconnect with contact locations on the die in electrical communication with the contact bumps formed on the conductive traces; and attaching the singulated interconnect on edge to the circuit board with the edge portions of the conductive traces in electrical communication with connection points on the circuit board.

23. The method as claimed in claim 22 and wherein the dice are attached to the interconnects and the interconnects are attached to the circuit board using a z-axis anisotropic adhesive.

24. The method as claimed in claim 23 and wherein the conductive traces are planarized.

* * * * *